United States Patent [19]

Smith et al.

[11] Patent Number: 4,876,150
[45] Date of Patent: Oct. 24, 1989

[54] LANGMUIR BLODGETT FILMS

[75] Inventors: Gilbert W. Smith, Worcester; Mervyn F. Daniel, Chester; John W. Barton; Norman M. Ratcliffe, both of Bristol, England

[73] Assignee: The Secretary of State for Defence in Her Majesty's Government of the United Kingdom of Great Britain and Northern Ireland, Sole of Whitehall, United Kingdom

[21] Appl. No.: 22,801
[22] PCT Filed: Jun. 25, 1986
[86] PCT No.: PCT/GB86/00371
§ 371 Date: Apr. 20, 1987
§ 102(e) Date: Apr. 20, 1987
[87] PCT Pub. No.: WO87/00347
PCT Pub. Date: Jan. 15, 1987

[30] Foreign Application Priority Data

Jun. 28, 1985 [GB] United Kingdom ............... 8516483

[51] Int. Cl.$^4$ ............................... B32B 9/04
[52] U.S. Cl. ........................... 428/411.1; 427/434.3
[58] Field of Search ................ 427/434.3; 428/411.1

[56] References Cited

U.S. PATENT DOCUMENTS 4,536,450 8/1955 Garito ............................... 430/270

OTHER PUBLICATIONS

L. M. Blinov, Polar Langmuir–Blodgett Films, 1984, vol. 120, Thin Solid Films, pp. 161-170.
M. F. Daniel, Prep of Non-Centrosym, L–B Films . . . , Mol. Cryst. Liq. Cryst. vol. 102, (Letters), pp. 193-198.

Primary Examiner—Edith Buffalow
Attorney, Agent, or Firm—Nixon & Vanderhye

[57] ABSTRACT

Langmuir-Blodgett(LB) films of ABAB structure in which the compounds A and B are different and contain complementary groups which result in non-centrosymmetry of the layer plane. Three types of structures are described: (1) in which A and B have similar backbones with complementary chromophore groups, (2) in which A and B have similar backbones with complementary functional groups, and (3) in which A and B have related functional groups but complementary backbones.

13 Claims, 4 Drawing Sheets

Fig.2.

LANGMUIR BLODGETT FILMS

This invention relates to Langmuir-Blodgett (LB) films, and to devices using such films.

An LB film is generally prepared by depositing a monolayer of a surface-active material onto a water surface, using now well established techniques. The molecules of the surface active material align in the monolayer, the hydrophilic ends remaining in the water, and the hydrophobic end projecting out of the surface. By other known techniques, this monolayer may be transferred essentially intact onto the surface of a solid substrate, and further monolayers deposited on the layer on the substrate to form a film, ie a Langmuir-Blodgett film.

Compounds used in LB films are generally long chain molecules, containing 14 or more carbon atoms in their chain, with a hydrophilic "head" and a hydrophobic "tail," such as long chain carboxylic acids, eg $CH_3(CH_2)_{14}CO_2H$, where the $CO_2H$ group constitutes the hydrophilic head.

LB films have properties, which make them useful in certain electronic devices.

Conventional (Y-type) LB films are symmetrical about their layer planes; However one of the most interesting features of the LB technique is the ability it gives to carry out the assembly of complicated molecular systems by depositing successive layers of different materials[2]. In particular multilayer films of the general type ABAB ... where A and B are monolayers of different materials, and are non-centrosymmetric, are expected to show interesting and potentially useful pyroelectric, piezoelectric and second order non-linear optical effects. A two compartment LB trough has been developed which allows the convenient fabrication of ABAB ... films[3].

Interest in pyroelectrics for thermal detectors is generally increasing because of their wide spectral response, sensitivity and lack of cooling requirements. Thin film pyroelectrics in particular are provoking much interest due to the shorter response times available with low thermal mass, large area capability, and compatibility with electronic readout devices such as the charge coupled device (CCD) or the pyro-FET. Being a low temperature technique the LB technique is compatible with semiconductor materials and large areas of uniform deposition are in principle possible.

To produce a pyroelectric effect a material must possess a spontaneous polarisation $P_s$ (C cm$^{-2}$) thus it must also possess a polar axis. This requires that the material be non-centrosymmetric. Normally $P_s$ is not directly observable due to compensation of the surface polarization charge by conduction charges from the material or atmospheric ions. However $P_s$ may be a function of the temperature T, and if T is changed slightly the compensation charges are too slow (since pyroelectrics are dielectrics) to follow the change in $P_s$ and a charge $\pm Q$ appears on the surface perpendicular to the polar axis; this is the pyroelectric effect.

We define the pyroelectric coefficient by $$P = dP_s/dT (C cm^{-2} K^{-1})$$

and therefore $$Q = pdT$$

Generally p is also p(T) but the variation is normally weak except near phase transitions in ferroelectric pyroelectrics. Therefore we can write $Q = p\Delta T$ where $\Delta T$ is a small change in T. Conventional high performance pyroelectrics have $p = 3 \times 10^{-8}$ C cm$^2$K$^{-1}$. Nearly all such materials are ferroelectrics operating close to their Curie temperature to obtain the high $dP_s/dT$.

In conventional Y-type LB films the molecular dipole moments of adjacent layers cancel and therefore $P_s = 0$. In an ABAB ... film the dipole moments of A and B being different do not cancel but add vectorally to give a non zero Ps and a polar axis perpendicular to the film plane. X and Z type films will also show a non-zero Ps; pyro-electricity and piezoelectricity in such films has been reported by Vlinov[4,5].

It is an object of the present invention to provide novel LB films which have improved pyroelectric and piezoelectric properties. Other objects and advantages will be apparent from the following description.

According to a first aspect of the invention a Langmuir-Blodgett film of ... ABAB ... structure is composed of compounds A and B which are different, A and B containing complementary groups that result in non-centrosymmetry of the layer plane, the layers of A and B being optionally separated by a counter layer.

By "complementary groups" it is meant that A and B contain different atomic groupings in their structures so as to result in non-centrosymmetric layering in the LB film.

Compounds A and B will normally be long chain molecules containing 14 or more carbon atoms, in an essentially linear skeleton, one end of the molecule being of generally hydrophilic character, the other being generally hydrophobic.

In preferred embodiments of the invention, the compounds A and B may have the following general structural types (i), (ii) and (iii):

(i) Compounds A and B may have a generally similar backbone in terms of disposition of functional groups, the length of their backbone, their molecular shape and polarity, but wherein A and B contain groups which are chromophores, which may be the same or different, which result in non-centrosymmetric layering of A and B in the LB film.

In one embodiment of this type, the chromophore group in A and B is the same, but the group is disposed within their moecular structures rotated through 180° about an axis perpendicular to the molecular skeleton relative to the positions of the hydrophilic and hydrophobic ends.

For example A may have a structure:

E-C-F and B may have a structure:

E$^1$-C$^1$-F$^1$ where E and E$^1$ may be the same or different, and are independently selected from:

$CH_3(CH_2)_i-$ where i is 2–20, F and F$^1$ may be the same or different, and are independently selected from:

$-(CH_2)_jCO.Z$ where j is 0 to 10, preferably 2 to 4 and Z is selected from —OH, $C_{1-6}$ alkyl and $NR^1R^2$ where $R^1$ and $R^2$ may independently be H or $C_{1-6}$ alkyl. F is a hydrophilic group. $E, E^1, F$ and $F^1$ may contain the same or different numbers of carbon atoms, in each case the total in E plus F and $E^1$ plus $F^1$ being 14 or more.

C and $C^1$ are chromophores which result in non-centrosymmetric layering of A and B in the LB film. C and $C^1$ may be the same or different, and are preferably selected from where X and Y are each independently selected from: $=NH$, $=NR^3$ ($R^3$ being $C_{1-4}$ alkyl), $=CO$, $=CH(CN)$, $=CN(ONO_2)$, $=CH$ (Halogen), —COO—, —OOC—, $=CH(ONO)$, —CO—NH—, —CO $NR^4$— (where $R^4$ is $C_{1-6}$ alkyl) and —O—.

It is preferred to use polar groups X and Y which undergo solid state reorganization, to give a large $dP_s/dT$ in the region of room temperature.

C and $C^1$ may respectively be in the molecules A and B, ie to give structures of the type:

and so that in these structures the chromophore is rotated through 180° relative to the positions of the hydrophilic and hydrophobic ends.

In LB films of the type (i) non-centrosymmetric layering occurs as below:

| A | B | A | B |
|---|---|---|---|
| E-C-F | $F^1$-$C^1$-$E^1$- | E-C-F | $F^1$-$C^1$-$E^1$ |
| E-C-F | $F^1$-$C^1$-$E^1$- | E-C-F | $F^1$-$C^1$-$E^1$ |
| E-C-F | $F^1$-$C^1$-$E^1$- | E-C-F | $F^1$-$C^1$-$E^1$ |

(the layer planes here being shown as running vertically)

In LB films of type (i), if it is considered necessary to interpose one or more counter-layers between the layers AB, a preferred material or counter-layers is a long chain alkyl amine of formula $CH_3(CH_2)_nNH_2$ where n is 16 to 26, preferably 18 to 20.

A particularly preferred chromophore group is (ii) Compounds A and B may have a generally similar backbone in terms of the length of their backbone, their molecular shape and polarity, but in which A and B contain different complementary functional groups which result in non-centrosymmetric layering in the LB film.

The functional groups which result in non-centrosymmetric layering are preferably located at the terminal position of the molecule.

For example A may be a molecule:

R—S and B may be a molecule:

P—Q where R and P may be the same or different functional groups or hydrophobic termini, and Q and S are different functional groups, —representing the molecular backbone, non-centrosymmetric layering in the LB film occurs as below:

| A | B | A | B |
|---|---|---|---|
| S—R | P—Q | S—R | P—Q |
| S—R | P—Q | S—R | P—Q |
| S—R | P—Q | S—R | P—Q |

(the layer planes being shown as running vertically)

Various preferred embodiments of this type are discussed below:

(a) A is a long chain alkyl amine of the structure $C_nH_{2n+1}.NH_2$ where n is an integer between 16 and 26, preferably 18 to 20. It has been found that at n greater than 24 the chain begins to become too rigid for use at room temperatures, and that at n less than 16 the amine becomes too soluble in the subphase.

B is a long chain fatty acid of the structure $R^5(CH_2)_mCOOH$ where $R^5$ is selected from $CH_3$ and $CH_2=CH$, and where m is independantly an integer within the limits and preferences set above for n.

(b) A is a long chain alkyl amine as defined in (ii)(a) above, and B is a compound of general structure:

in which k is 2 to 20, l is 0 to 10 preferably 4, X, Y and Z are as defined in connection with type (i) above.

An example of such an A-B combination is A is stearylamine (n-octadecylamine $C_{18}H_{37}$—$NH_2$)

B is

(c) A is a long chain alkyl amine as defined in (ii)(a) above, and B is a compound of the structure:

where p is 6 to 25, preferably no more than 21.

(iii) Compounds A and B may have the same or a closely related functional group and different complementary structural backbones which result in non-centrosymmetric layering in the —ABAB—film.

The functional group is preferably located at a terminal position in the molecule. A preferred functional group is —COZ, with Z as defined above, especially —OH, ie. a carboxylic acid group. One or more of the compounds A and B may contain a chromophore, such as where X and Y are as defined above.

In a preferred LB film of this type:

A is a long-chain alkyl carboxylic acid of general formula:

where $R^5$ and m are as defined above, and

B is a chromophore—containing compound of general formula:

where k, X, Y, l and Z are as defined above.

In this description the term "chromophore" is used as that part of a molecule which produces its colour, or its light absorbance in the non visible region of the spectrum. Preferred chromophores are polar chromophores, as it is polarity of the chromophore which is responsible for their pyroelectric activity in LB film rather than their light absorbance.

Langmuir Blodgett films according to the invention show pyroelectric activity in the region of room temperature. Some may also show piezoelectric behaviour. Films according to the invention which have a high degree of polarisable structure may also show non-linear optical properties.

Films according to the invention also have the advantage that their polarisation is solidly built into their structure, and is thus unlikely to be lost or reversed at an electric field strength below the dielectric breakdown field.

Langmuir Blodgett films according to the invention may be prepared by known means, for example using the apparatus and method described in reference 3.

Films according to the invention may be used in electro optical and other electronic devices which use a Langmuir Blodgett film as a sensing element, and therefore according to a further aspect of the invention an electronic device is provided which incorporates a Langmuir Blodgett film as described above as its sensing element. In particular there is provided a thermal sensor which incorporates as its sensing element a Langmuir Blodgett film according to the invention. Such devices may be constructed using methods known in the art.

The invention will now be described by way of example only with reference to the accompanying FIGS. 1 to 4, which show.

EXPERIMENTAL DETAILS

1. Materials

Saturated carboxylic acids were obtained from Sigma (99%). Stearylamine (n-octadecylamine) was obtained from ICN Pharmaceuticals Inc. ω-tricosenoic acid ($CH_2=CH(CH_2)_{20}COOH$) was kindly supplied by Dr A Barraud and A Ruaudel-Teixier (CEN Saclay) and Gedye$_{22}$ was kindly supplied by Dr G L Gaines Jr., (General Electric Company). All the above were used without further purification. The dye called 18ON4A was synthesised using a standard method. All the materials were spread from high purity solvents (BDH Ltd Aristar grade) usually 1,1,1 trichloroethane or chloroform.

Gedye$_{22}$ is an abbreviation for the compound:

18ON4A is an abbreviation for the compound:

Other compounds were synthesised as described below:

Compounds of the general formula

Class 1

(a) Phenol (0.1 mole) and sodium hydroxide (0.1 mole) in ethanol (100 ml) were stirred and refluxed during the dropwise addition of an appropriate 1-bromo alkane (0.095 mole), stirring and refluxing being continued until the 1-bromo alkane was consumed, as evidenced by TLC (typically 12 hr) after removal of the ethanol solvent, the reaction mixture was diluted with water and the product extracted with chloroform. The dried extract was vacuum evaporated and the residue crystallised from light petroleum to give the phenoxy alkane (Yield ca. 80%).

(b) Aluminium chloride (0.03 mole) was added to a solution of the above phenoxy alkane (0.01 mole) and the methyl ester chloride of the appropriate alkane dioic acid (0.0105 mole) in dichloromethane (20 ml). The mixture was stirred at room temperature for 24 hr or until TLC showed the absnece of starting material, then hydrolysed with dilute hydrochloric acid and ice. Chloroform extraction and vacuum evaporation gave the keto-ester which was recrystallised from light petroleum (Yield ca. 80%).

(c) The above keto-ester (0.01 mole) was refluxed with sodium hydroxide (0.04 mole) in ethanol (15 ml.) and water (2 ml.), until TLC showed the absence of starting material (ca. 1 hr). After removal of the solvent ethanol the product was collected by chloroform extraction. Concentration of the dried extract gave the ketoacid which was further purified by recrystallisation from chloroform.

Compounds of the general formula

Class 2

(a) w-Phenoxyalkanoic esters. The requisite w-bromalkanoic acid ester was made by stirring the commercially available acid (2 g.) with the appropriate alcohol (70 ml.) at room temperature, the reaction bbeing catalysed by the addition of a small amount of acetyl chloride. After 24 hr., or when TLC indicated total conversion, the excess alcohol was removed by vacuum distillation and the ester taken up in chloroform. The extract was washed with sodium bicarbonate, water, then dried and vacuum evaporated to give the ester which was used directly without further purification. Alkylation of phenol with the w-bromoester was carried out as in 1(a) above using the same alcohol as solvent as was used in the previous esterification step to avoid trans-esterification.

(b) Acylation of w-phenoxyalkanoic esters. The requisite acyl chlorides were prepared from commercially available alkanoic acids by reaction with thionyl chloride, and purified by vacuum distillation. The acylation reaction was carried out using the method outlined in 1(b) above, the resulting ketoester being hydrolysed to the w-(4-alkanoylphenoxy) alkanoic acid by the method of 1(c) above.

Compounds of the general formula

Class 3

(a) w-(N-methyl-N-phenylamino) alkanoic esters. A mixture of N-methylaniline (0.1 mole), the methyl or ethyl w-bromoalkanoate of 2(a) above (0.1 mole), and sodium carbonate (0.3 mole) in hexamethylphosphorus triamide (50 ml.) was stirred and heated at 140° C. until TLC showed total conversion of starting material ca. 20 hr.), then cooled and diluted with water (200 ml.). The precipitated acid was collected, washed, and recrystal-lised from ethanol. Acids which precipitated as oils were collected by chloroform extraction prior to recrystallisation.

(b) w-N-(4-formylphenyl)-N-methylamino alkanoic esters. The aminoester from (a) (0.005 mole) was added to phosphorus oxychloride (5 ml.) in N,N-dimethylformamide (20 ml.) at room temperature. The mixture was heated at 90°–95° C. for 2 hr., then cooled and neutralised with aqueous sodium hydroxide. The crude aldehydic ester was collected by extraction with ethyl acetate and purified by chromatography over silica in ethyl acetate—light petroleum, prior to recrystallisation from light petroleum (Yield ca. 75%).

(c) A solution of Grignard Reagent was prepared from the requisite alkyl halide (0.006 mole) and magnesium turnings in dry tetrahydrofuran (30 ml.) under argon. The above aldehydic ester (0.004 mole) in dry tetrahydrofuran (5 ml.) was cooled to $-15°$ C. and the solution of Grignard reagent added dropwise during 10 min. The reaction mixture was stirred at $-15°--5°$ C. until TLC showed no further conversion (ca. 45 min), then hydrolysed with aqueous ammonium chloride and extracted with ether. Evaporation of the dried ethereal extracts and chromatography of the residue over silica in ethyl acetate-light petroleum gave the alcohol (ca. 55%) which was oxidised directly.

(d) The above alcohol is dichloromethane (5 ml.) was treated with pyridinium dichromate (0.014 mole) and stirred at 0° C. for 12 hr. The reaction mixture was diluted with water and the ketoester collected by ether extraction. It was purified by chromatography over silica with ethyl acetate—light petroleum (Yield ca. 30%).

(e) The ketoester (0.003 mole) was refluxed with sodium hydroxide (0.009 mole) in ethanol (18 ml.) and water (2 ml.) until reaction was complete as determined by TLC. On cooling, the solution was acidifed with dilute hydrochloric acid. The precipitated ketoacid was collected, washed and recrystallised from chloroform (Yield ca. 70%).

Using the methods described above, compounds as follows were prepared:

|  | m | n |
|---|---|---|
| Class 1 | 8 | 4 |
| " | 11 | 4 |
| " | 15 | 4 |
| " | 15 | 2 |
| Class 2 | 17 | 4 |
| Class 3 | 17 | 4 |
| " | 17 | 6 |
| " | 17 | 8 |

2. Multilayer Deposition

All films were deposited on aluminized glass cover slips cut to 2 cm square. The cover slips were cleaned ultrasonically in Decon-90 followed by rinsing in pure filtered water and drying in a stream of nitrogen before evaporation of the 1 cm wide aluminum electrode stripe (<60 nm thickness) in a cryogenically pumped (oil free) vacuum coater. Thickness control was achieved by use of a quartz crystal monitor at the substrate plane. The source was a resistively heated tungsten filament and the source to substrate distance was 40 cm.

Stearylamine/carboxylic acid ABAB . . . films were produced using the RSRE two-compartment trough[3].

Each compartment was maintained at a surface pressure of 30 mN m$^{-1}$ over a subphase of pure water (original resistivity 18M ω cm). Transfer to the substrates was effected at ~5 mm sec$^{-1}$ with the amine being deposited on the down stroke. Transfer ratios were near unity.

Stearylamine/Gedye$_{22}$ films were deposited with the surface pressure in the Gedye compartment being 25 mN m$^{-1}$. The subphase contained 10$^{-3}$M ammonium sulphate and was maintained at a pH of 7.5±0.3. Transfer was effected at ~1 cm min$^{-1}$ to allow the Gedye film to drain. Stearylamine was transferred on the down stroke.

Stearylamine/180N4A films were deposited under identical conditions to the stearylamine/carboxylic acid films.

In all cases two substrates were coated together. After deposition the films were left for 24 hrs before evaporation of a top aluminium electrode stripe perpendicular to the first. The final device area was 1 cm$^2$.

3. Preliminary Film Assessment (a) Infrared spectroscopy

Infrared spectra were obtained using a Perkin Elmer 983G infrared spectrometer. The samples were deposited as films 50 layers thick on the polished faces of Ge prisms (5×1.5×0.2 cm, Harrick Scientific Corp) and the measurement was made using the technique of attenuated total reflection (ATR)6.

(b) Dielectric Measurement

Capacitance and tan δ data were obtained using a Hewlett-Packard 4274ALCR meter. The signal amplitude was set at 50 mV. All measurements were made in laboratory ambient conditions on the samples assessed for pyroelectric activity.

(c) X-ray d-spacings

Measurements were made on a 50 layer ABAB film of stearylamine/arichidic acid deposited on a silanized unaluminized cover slip. A low-angle diffractometer with Cu K radiation was used.

4. Pyroelectric Assessment

This was carried out using dynamic and static methods as described in G W Smith, M F Daniel, J W Barton and N Ratcliffe, Proc. Conf. on Langmuir Blodgett Films, Schenectady NY, July 1-4 1985, in Thin Solid Films (TSF ref. 8560).

Results

1. Infrared Spectra

The results indicated the formation of the ions C$_{19}$H$_{39}$COO$^-$ and C$_{18}$H$_{37}$NH$_3^+$ due to proton transfer between the acid and the amine. The 'salt' of these two ions has therefore been formed, with a large dipole moment.

2. Pyroelectric Measurements

The static method was found to allow determination of temperature changes more accurately and results are summarised briefly in Table 1.

In Table 1 the following values are given:
d=X-Ray d-spacings
$\epsilon_r$=dielectric constant tan δ
p=pyroelectric coefficient Since P$_s$ is dipole moment/unit volume and since the hydrocarbon tails of the saturated fatty acids contribute to the molecular volume but not significantly to the dipole moment we attempted to introduce a systematic variation in P$_s$ and hence hopefully in p by varying the length of the fatty acid B layers in our films. It is obvious from Table 1 that this objective has not been achieved. Calculation yields an expected change in P$_s$ of 15% on going from C$_{18}$ acid to C$_{24}$ acid and this small change, if it appears at all in p, is lost in the scatter of the results. All the amine/saturated acid films give p~5×10$^{-11}$C.cm$^{-2}$.K$^{-1}$.

Films of stearylamine with the unsaturated fatty acid ω-tri-cosenic acid consistently gave values twice as high p=1×10$^{-10}$C. cm$^{-2}$.K$^{-1}$. This presumably reflects the temperature dependence of the dipole moment of the terminal double bond (0.3 D) since that is the only difference between ω-tricosenoic acid and saturated carboxylic acids.

Films incorporating the merocyanine dye Gedye$_{22}$ gave very low values of p (8×10$^{-12}$C cm$^{-2}$K$^{-1}$). These films when measured has the dye in its yellow form[2] with the enolic oxygen protonated, which reduces the intramolecular charge transfer contribution to the dipole moment. Also there is no amine/acid salt formation. So P$_s$ for these films may be small compared with the amine/acid films and this may explain the small value of p. The higher value for εr is an indication of the high polarisability of the chromophore which has possibilities for non-linear optics.

Also included in Table 1 for comparison are the data obtained for a Y-type film of ω-tricosenoic acid showing the very small observed pyroelectric effect in a centrosymmetric LB film which may be due to small differences in the transfer ratios in the up and down directions or residual drift in the apparatus.

Figure 1:
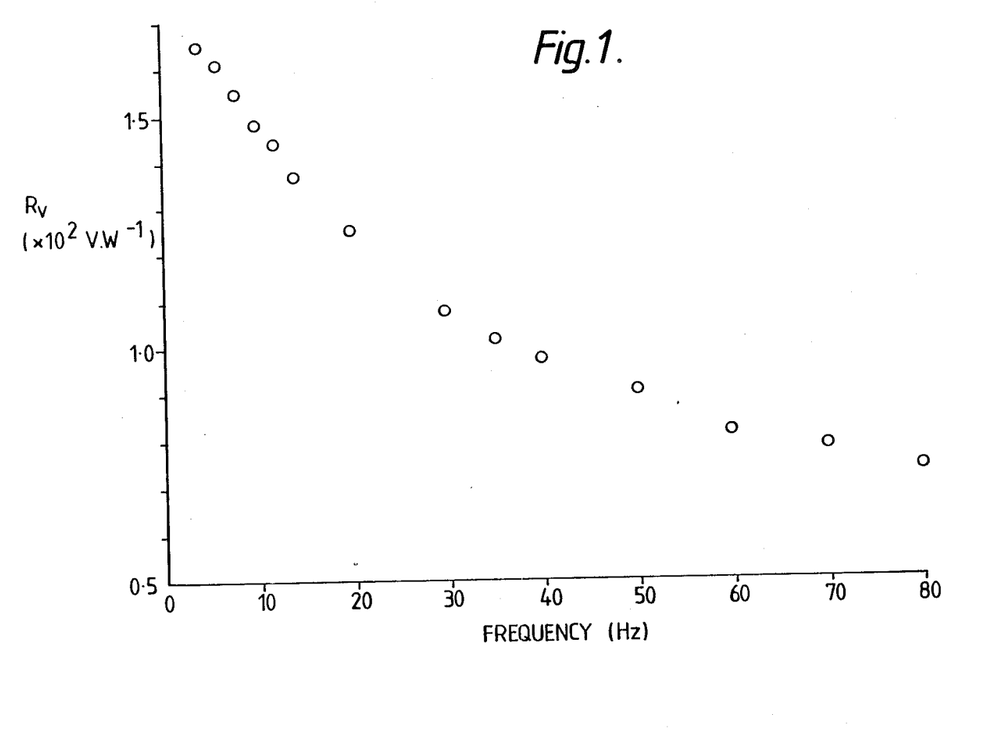
FIG. 1 Voltage responsivity versus chopping frequency for . . . ABAB . . . LB film of stearylamine/ω-tricosenic acid. Total thickness 500 layers.
Figure 2:
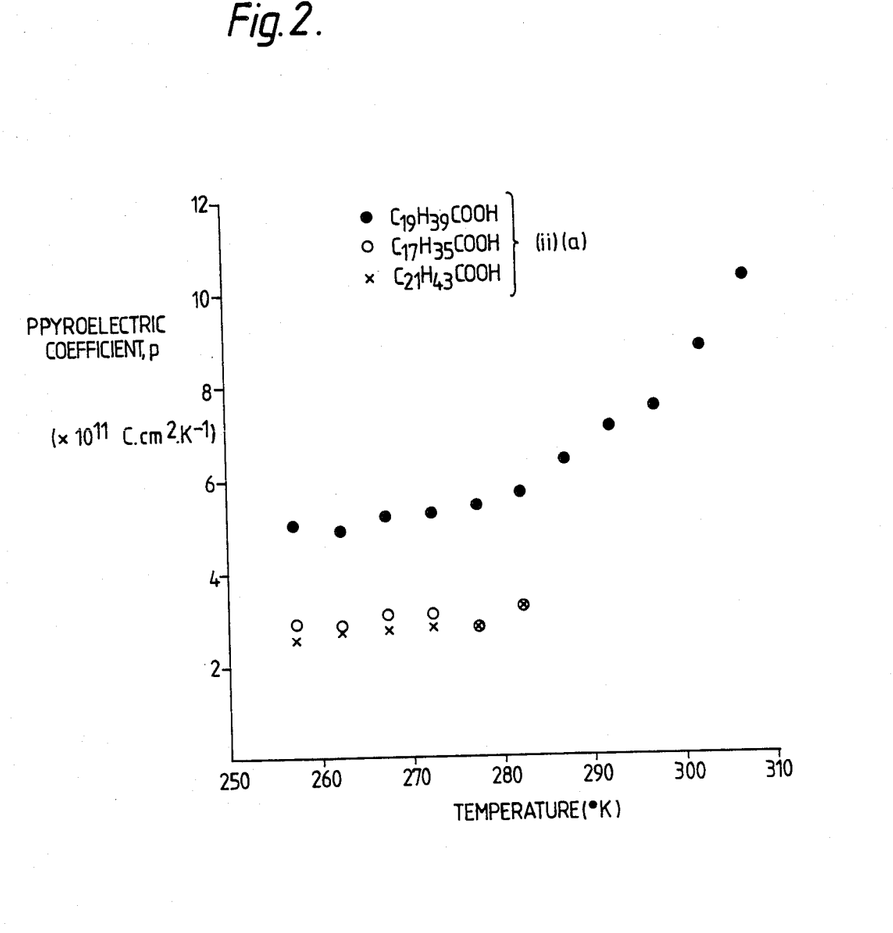
FIGS. 2, 3, 4 Pyroelectric coefficient (p) versus absolute temperature (°K.) for various LB films of types (i), (ii)(a), (ii)(b) and (iii).

The temperature dependence of p for ABAB ... films of stearylamine with various fatty acids is shown in FIG. 2. The low

TABLE 1

| A | B | d (μm) | $\epsilon_r$ (1kHz) | tan δ | p(Ccm$^{-2}$K$^{-1}$) (280–285K) |
|---|---|---|---|---|---|
| CH$_2$CH(CH$_2$)$_{20}$COOH | CH$_2$CH(CH$_2$)$_{20}$COOH | 0.45 | 2.85 | 0.0007 | 2 × 10$^{-12}$* |
| C$_{18}$H$_{37}$NH$_2$ | C$_{17}$H$_{35}$COOH | 0.26 | 2.71 | 0.016 | 3.2 × 10$^{-11}$ |
| " | C$_{19}$H$_{39}$COOH | 0.13 | 2.48 | 0.020 | 5.8 × 10$^{-11}$ |
| " | C$_{21}$H$_{43}$COOH | 0.23 | 2.82 | 0.033 | 3.3 × 10$^{-11}$ |
| " | C$_{23}$H$_{47}$COOH | 0.15 | 2.66 | 0.009 | 6.0 × 10$^{-11}$ |
| " | Gedye$_{22}$ | 0.23 | 6.49 | 0.04 | 8.1 × 10$^{-12}$ |
| " | 180N4A | 0.14 | 3.24 | 0.006 | 2.25 × 10$^{-10}$ |

TABLE 1-continued

| A | B | d (μm) | $\epsilon_r$ (1kHz) | tan δ | $p(Ccm^{-2}K^{-1})$ (280–285K) |
|---|---|---|---|---|---|
| " | $CH_2CH(CH_2)_{20}COOH$ | 0.40 | 2.91 | 0.094 | $1.14 \times 10^{-10}$ |

Gedye$_{22}$ is: $CH_3(CH_2)_{21}$—N...

180N4A is: $CH_3(CH_2)_{17}$—C...—N—$(CH_2)_4COOH$ with $CH_3$

*Y-type film for comparison.

temperature limit was determined by the cooler and the high temperature limit by the background current, which varied from film to film but always increased sharply above room temperature. it is obvious that p increases at higher temperatures with the rate of increase being much higher above about 280 K. Below that temperature all three curves are quite parallel. This general trend of p(T) was found for all films examined.

X-RAY MEASUREMENTS

The bilayer repeat distance for a 50 layer film of stearylamine arachidic acid has been determined to be 49 Å. This is somewhat smaller than the value one would calculate from measuring molecular models (54 Å) and indicates a degree of molecular tilt within the layer planes.

DISCUSSION

By making certain assumptions it is possible to calculate an approximate maximum value of $P_s$ for the amine/acid films. Assuming complete proton transfer, a resulting charge separation of 0.3 nm and a bi-molecular (acid+amine) volume of $1.25 \times 10^{-27}$ m$^3$ we obtain Ps=4 μC cm$^{-2}$. The observed values for p therefore represent a change in $P_s$ of ~10 ppm K$^{-1}$. It is interesting to note that the calculated value for $P_s$ is similar to that measured for the high performance pyroelectric TGS (triglycine sulphate)[9] (2.7 μC cm$^{-2}$). The greater than 500 fold difference in p is therefore even more striking. However TGS is ferroelectric which means that its polarisation can be switched by a sufficiently high field applied for long enough and that its polarisation vanishes above its Curie temperature by a crystallographic rearrangement. For an ABAB ... film the polarisation is solidly built into the structure and one cannot conceive of any electric field short of the dielectric breakdown field which would change that. Similarly no temperature below the melting point is likely to change $P_s$ significantly. The low values of p are thus explained by the fact that the charge on the headgroups is probably invariant with temperature and the only change in $P_s$ is due to a change in molecular volume due to thermal expansion.

Films containing the 18ON4A dye will have larger values of $P_s$ than stearylamine/fatty acid films because the dipole moment of the chromophore is in the same sense to that at the head group. The higher observed value of p then probably means one of two things. Either the dipole moment or the orientation of the chromphore within the films changes thus changing the projection of its dipole moment on the polar axis (film normmal) and its contribution to $P_s$. We cannot as yet decide between these two options.

In all the films so far examined the effect of increasing the temperature is to decrease $P_s$.

CONCLUSIONS

We have succeeded in producing ABAB ... films of stearylamine with various film forming materials. As expected these films exhibit pyroelectric acivity and we have meaured this as a function of temperature and material. Calculation of $P_s$ for the amine/fatty acid films yields a surprisingly high value which is not refelected in p. Films containing 18 ON 4A, display a larger value for p. It thus appears that much can be done to increase p by introducing polar groups with the right characteristics.

In a further series of experiments, LB films of types (iii) and (i) above were prepared and investigated. These contained the compounds:

18ON4A   (see above)

18ON04A  $CH_3(CH_2)_{17}N$—...—C.$(CH_2)_4COOH$ with $CH_3$

140' 04A  $CH_3(CH_2)_{13}O$—...—C.$(CH_2)_4COOH$

Eicosanoic acid    $CH_3(CH_2)_{18}COOH$

Experimental Method

The compounds were repeatedly recrystallised and their purity checked by thin layer chromatography and mass spectroscopy.

Dilute solutions (0.2–1.0 mg/ml) in 'Aristar' (BDH Ltd. UK) grade solvents were spead on a commercial two compartment trough incorporating the RSRE gate design as described above. Pressure was maintained at ±1 mN m$^{-1}$ of the set transfer pressure for each material. The subphase conditions were pH=8.5±0.2; Cd$^{2+}$=2.5×10$^{-4}$M. The subphase had an original resisitivity of 18MΩ cm. Substrate speeds of 1 mm/sec were used. 18ON4A was normally dipped on the up stroke, 140' 04A and 13N04A on the up stroke. Eicosanoic acid could be dipped on either stroke. The substrates and electrode arrangement was as described above.

Pyroelectric coefficients and dipole moments were determined by known techniques (ref. 10 and 11). An ambient of dry nitrogen gas was used throughout.

Results

(1) Type (iii) Films

Figure 4:
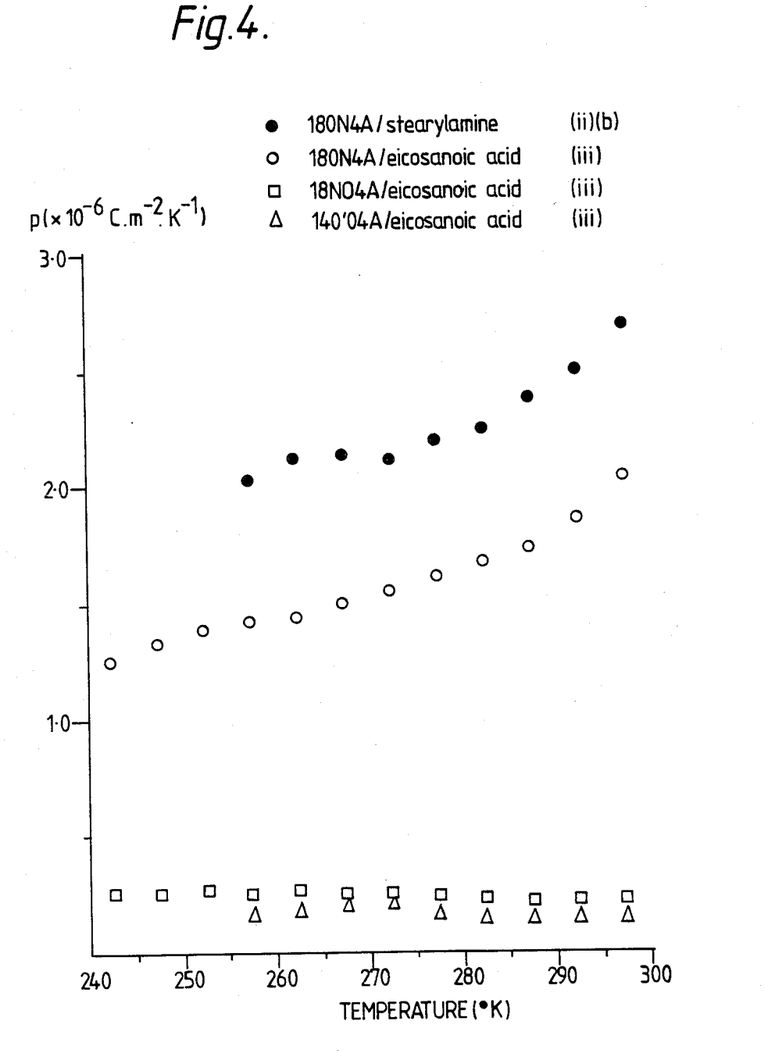

Results are given in Table 2 below, and graphically in FIG. 4. The sign of the pyroelectric current was the same in all three films. Cooling produced a current from the bottom to the top electrode, therefore Ps increases with decreasing temperature. Reversing the deposition order for the 180N4A/eicosanoic acid film reversed the direction of current flow. p increased with temperature for most of the films.

TABLE 2

| A | B | $\mu$ ($\times 10^{-9}$ Cm) | bilayer rep. dist. | tilt° | Ps ($\times 10^{-3}$ Cm$^{-2}$) | p ($\times 10^{-7}$) |
|---|---|---|---|---|---|---|
| eicosanoic acid | 140'04A | $1.2 \pm 0.3$ | 5.52 nm | 28.9 | 7.9 | 1.6 |
| — | 180N4A | 1.9 | 5.4 nm | 43 | 9.3 | 1.9 | note:
tilt = tilt of chromophore conatining group B with respect to film normal.

In these films use of 180N4A is thus shown to give better Ps an p.

(2) Type (i) films

Two different structures of type (i) containing a chromophore in each layer have been prepared, ie:

| | A | B |
|---|---|---|
| | 140'04A | 180N4A |
| and | 18N04A | 180N4A |

Figure 3:
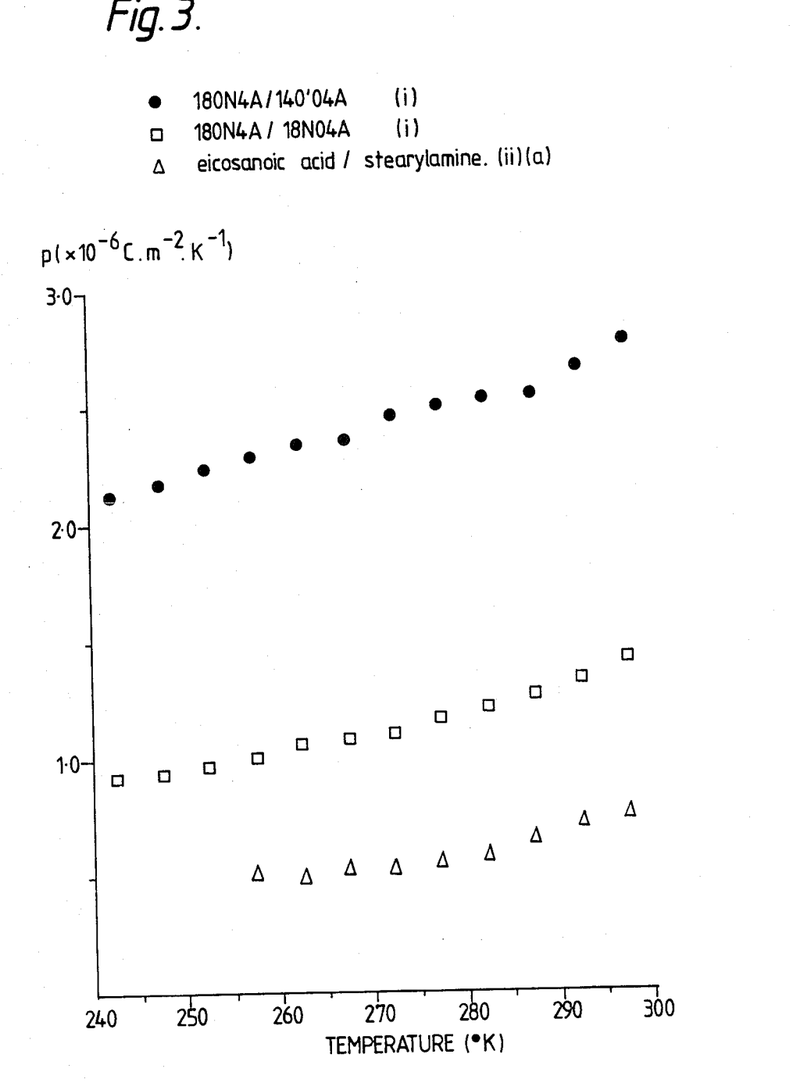

The results for these two films are shown in FIG. 3.

The pyroelectric response of 140'04A/180N4A was about twice that of 18N04A/180N4A.

References

1. K B Blodgett, J Am Chem Soc., 57 (1935) 1007
2. M F Daniel and G W Smith, Mol Cryst Liq Cryst (Lett) 102 (1984)193.
3. M F Daniel, J Dolphin, A J Gran, K E N Kerr and G W Smith, Thin Solid Films.
4. L M Blinov, N N Davydova, V V Lazarev and S G Yudin, Sov Phys Solid State, 24 (9) (1982) 1523.
5. L M Blinov, N V Dunbinin, L V Mikhnev and S G Yudin, Thin Solid Films, 120 (1984) 161.
6. N J Harrick, Internal Reflection Spectroscopy, Interscience 1967.
7. E H Putley, Semicond Semimetal V, Chapt. 6 (1970)
8. H Blackburn and H C Write, Infrared Physics 10 (1970) 191.
9. I S Zheludev, Physics of Crystalline Dielectrics, Vol I, Plenum 1971.
10. G W Smith, M F Daniel, J W Barton and N Ratcliffe, Proc. Conf. on Lagmuir—Blodgett Films, Schenectady N.Y., July 1–4 1985, in Thin Solid Films (TSF ref 8560).
11. E P Raynes, Mol Cryst Liq Cryst (Lett.) 1 (1985) 69.

We claim:

1. A Langmuir-Blodgett (LB) film of ABAB structure composed of a combination of compounds A and B which are different and which are selected from the group consisting of: AB combinations wherein A has the formula E-C-F and B has the formula $E^1$-$C^1$-$F^1$, wherein E and $E^1$ are independently $CH_3(CH^2)_i$— where i is 2-20, F and $F^1$ are independently —$(CH_2)_j$—COZ wherein j is 1-10 and Z is —OH, $C_{1-6}$ alkyl or $NR^1R^2$ wherein $R^1$ and $R^2$ are independently H or $C_{1-6}$ alkyl, C and $C^1$ are independently where X and Y are each independently selected from the group consisting of =NH, =$NR^3$, =CO, =CH.CN, =CHONO, =CH(Halogen), —COO—, —OOC—, =CH(ONO)— CO—NH—, —CO.$NR^4$ and —O— where $R^3$ is $C_{1-4}$ alkyl and $R^4$ is $C_{1-6}$ alkyl; AB combinations wherein A is a long chain alkyl amine having the structure $C_nH_{2n+1}$)—$NH_2$ where n is 16-26, and B is a long chain fatty acid having the structure $R^5(CH_2)_mCOOH$ where $R^5$ is selected from the group consisting of $CH_3$ and $CH_2$=CH and where m is 16-26; AB combinations wherein A is a long chain alkyl amine having the structure $C_nH_{(2n+1)}$—$NH_2$ where n is 16-26 and B is a compound of general structure:

in which K is 2-20, 1 is 0 to 10, and X, Y and Z are as defined above; and AB combinations wherein A is a long chain carboxylic acid of the formula $R^5(CH_2)_mCOOH$ where $R^5$ and m are as defined above and B is a compound of the formula:

where K, is 2-20 l, X, Y and Z are as defined above.

2. A LB film according to claim 1, wherein A has the formula E-C-F, and B has the formula $E^1$-$C^1F^1$ wherein E, C, F, $E^1$, $C^1$ and $F^1$ are as defined in claim 1.

3. An LB film according to claim 2, wherein the layers A and B are additionally separated by at least one counter-layer of an alkyl amine of the formula $CH_3(CH_2)_nNH_2$ where n is 16-26.

4. An LB film according to claim 2 wherein A is:

-continued and B is:

wherein E, E¹, F, F¹, X and Y are as defined in claim 1, the two X groups are the same and the two Y groups are the same.

5. An LB film according to claim 4, wherein A is:

and B is:

6. An LB film according to claim 2, wherein A is:

and B is:

7. An LB film according to claim 1, wherein A is a long chain alkyl amine of the structure $C_nH_{(1=2n+1)}$—$NH_2$ where n is 16–26, and B is a long chain fatty acid of structure $R^5$ and is selected from $CH_3$ and $CH_2$=$CH$ and where m is 16–26.

8. An LB film according to claim 7, wherein n is 18, and $R^5(CH_2)_m$ is selected from the group consisting of $C_{17}H_{35}$, $C_{19}H_{39}$, $C_{21}H_{43}$, $C_{23}H_{47}$ and $CH_2$=$CH(CH_2)_{20}$.

9. An LB film according to claim 1, wherein A is a long chain alkyl amine of the structure $C_2H_{(2n+1)}$—$NH_2$ where n is 16–26, and B is of a compound of the structure:

in which K is 2–20, l is 0 to 10, and Y and Z are as defined in claim 1.

10. An LB film according to claim 9 wherein n is 18 and B is:

11. An LB film according to claim 1, wherein A is a long chain carboxylic acid of the formula $R^5(CH_2)_mCOOH$ where $R^5$ and m are as defined in claim 1 and B is a compound of the formula:

where k is 2–20, l is 0 to 10 and X, Y and Z are as defined in claim 1.

12. An LB film according to claim 1 wherein $R^5(CH_2)_m$ is $CH_3(CH_2)_{18}$ and B is selected from 13. An electro optical device incorporating an LB film according to claim 1, 2, 3, 4, 5, 6, 7, 8, 9, 10, 11 or 12.

* * * * *